United States Patent [19]
Wise

[11] 3,939,303
[45] Feb. 17, 1976

[54] DIGITAL VIDEO MODULATION APPARATUS

[75] Inventor: Frederick Henry Wise, London, England

[73] Assignee: Independent Broadcasting Authority, London, England

[22] Filed: Aug. 13, 1973

[21] Appl. No.: 387,769

[30] Foreign Application Priority Data
Aug. 15, 1972 United Kingdom............... 38075/72

[52] U.S. Cl.................. 178/7.1; 325/182; 332/37 R; 332/9 R
[51] Int. Cl.²........................................... H04N 5/40
[58] Field of Search..................... 178/7.1; 325/182; 332/37 R, 9 R

[56] References Cited
UNITED STATES PATENTS
| | | | |
|---|---|---|---|
| 3,548,342 | 12/1970 | Maxey | 325/182 X |
| 3,793,597 | 2/1974 | Toman | 332/9 R |

*Primary Examiner*—Robert L. Richardson
*Attorney, Agent, or Firm*—A. W. Breiner

[57] ABSTRACT

A modulator for producing a digital sub-carrier amplitude modulated by a video or other modulating signal comprises sampling means for sampling the modulating signal at twice the process carrier frequency, and selector means for feeding the samples to an output with alternate samples changed in value whilst preserving their timing relative to the remaining samples.

6 Claims, 10 Drawing Figures

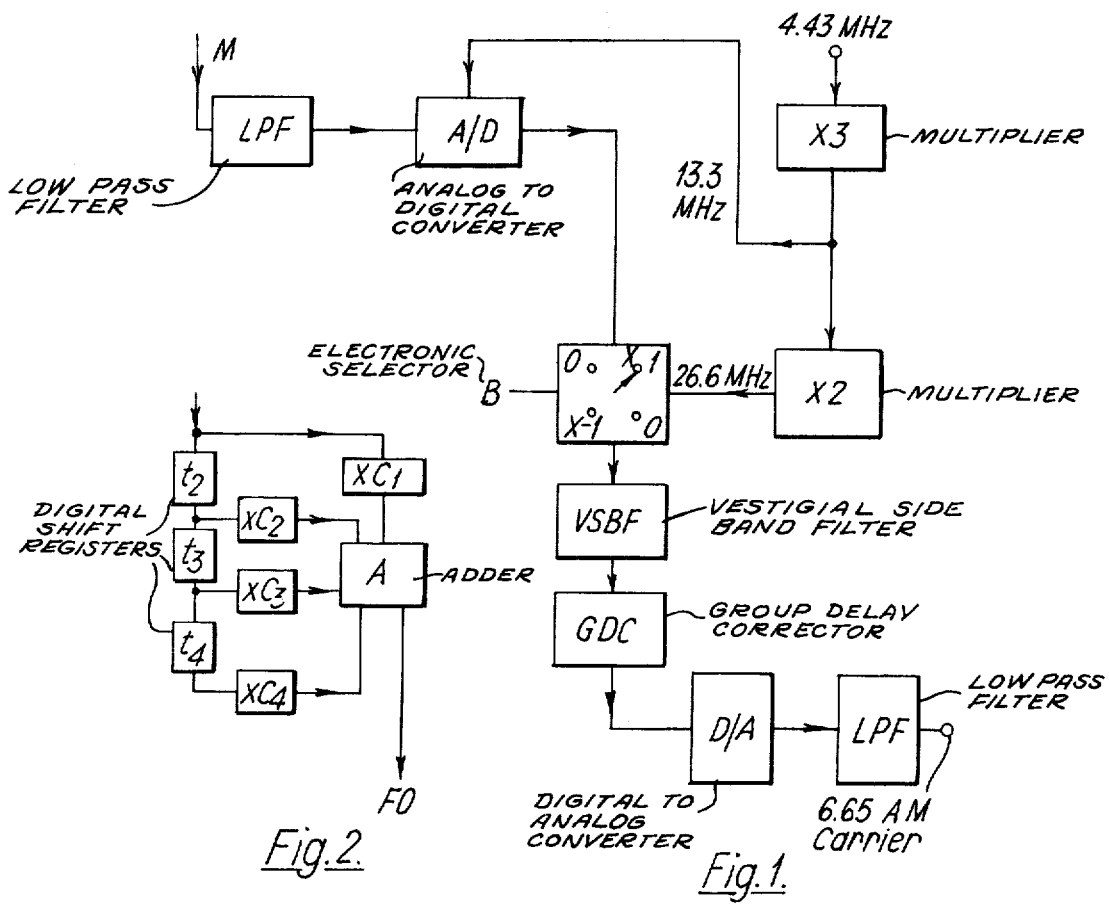
Fig.2.
Fig.1.
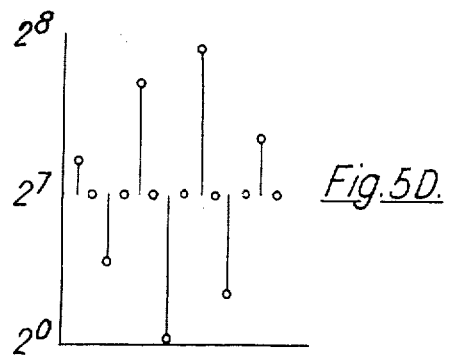
Fig.5D.

DIGITAL VIDEO MODULATION APPARATUS

SPECIFICATION OF THE INVENTION

The present invention relates to television apparatus and has as an object the provision of television apparatus in a novel and advantageous form. The provision of television apparatus which operates in the digital, rather than the conventional analog, mode is potentially attractive in that it can be expected to eliminate difficulties in achieving and maintaining correct adjustment. Although digital apparatus is unlikely to be employable in domestic television receivers in the early future different economic considerations apply to monitors and signal processing equipment used between the camera and the transmitter.

In accordance with the present invention there is provided apparatus for producing, at an output, digital output signals defining the timing and level of the peak values and the timing of the zero values, for a subcarrier signal amplitude modulated by a modulating signal which comprises means for sampling the modulating signal at a rate twice the process-carrier frequency and selector means for feeding the samples to an output with alternate samples changed in their sense whilst preserving their timing relative to the remaining samples. The apparatus has special value when provided in a form for modulation by video signals, but may be provided in a form for modulation by signals of a relatively small bandwidth, e.g. single or multi-channel audio signals or facsimile signals if desired.

The sub-carrier will have a frequency which is greater than the maximum frequency component of the modulating signal, but is substantially less than is required for a carrier useful for transmission by radiation.

In the apparatus of the invention, means are provided for introducing nominally zero signals (i.e. signals representing zero level) mid-way between the samples, thereby to define the occurrence of the zero levels of the process-carrier. The resulting digital signal is equivalent to a modulated sub-carrier sampled at four times the sub-carrier frequency.

A convenient selector has an operating cycle of four stages, viz.

a. passing a sample in the positive sense
b. passing a nominally zero signal
c. passing the next sample in the positive sense, and
d. passing the next nominally zero signal.

In one form of the apparatus the alternate signals are changed in their sense by a multiplier and the remaining signals are also passed through a multiplier or other circuit so that the alternate signals and the remaining signals are subjected to equal delays.

In another form of the apparatus the selector is operable to add alternate signals to a constant and subtract the remaining signals from the same constant. This arrangement is convenient in that it involves adding and subtracting devices rather than multiplying devices, does not necessitate the provision of a separate switching function and is readily arranged to introduce the nominally zero signals in the form of the unchanged constant.

The output from the apparatus may in some cases be transmitted by cable in digital form or be recorded in digital form. Normally however it is required for transmission and for this purpose the apparatus is provided with a digital-to-analog converter for passing the carrier to a transmitter in analog form. Advantageously, the apparatus when used for television transmission is provided with a digital vestigial side band filter for the digital output signals which may be arranged to compensate for the transfer characteristic of the power amplifier of the transmitter.

The following descriptin in which reference is made to the accompanying drawings is given in order to illustrate the invention. In the drawings:

FIG. 1 shows a first modulator circuit in accordance with the invention.

FIG. 2 shows the general arrangement of a digital filter of the kind employable in apparatus according to FIG. 1, FIGS. 3A, 3B and 3C show the operation of the modulator circuit of FIG. 1 diagrammatically, FIGS. 5A, 5B, 5C and 5D show the operation of the circuit of FIG. 4.

With the apparatus of FIG. 1, a video signal M is passed through a low pass filter LPF of conventional analog type and digitised by an analog-to-digital converter A/D operated at a sampling ratio of 13.3 MHz by a 4.43 MHz source and X3 multiplier or by equivalent means. The digital signals are passed to an electronic selector B shown for simplicity of illustration as a four pole bank rotary switch B operated at 26.6 MHz (on a contact per second basis) by an X2 multiplier fed by the X3 multiplier.

Figure 3A:
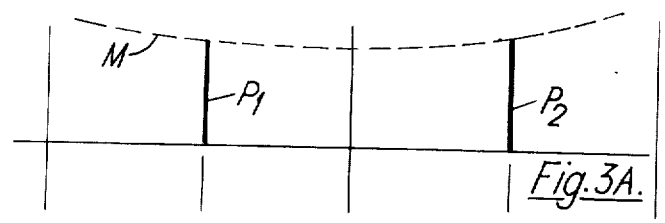
Figure 3B:
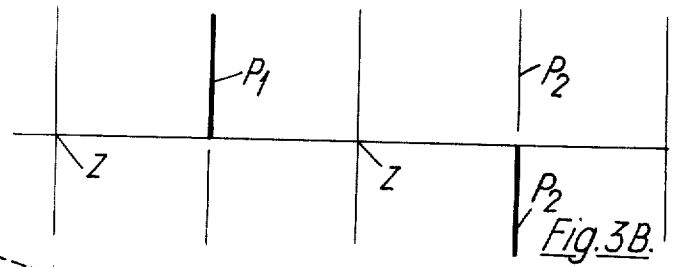
Figure 3C:
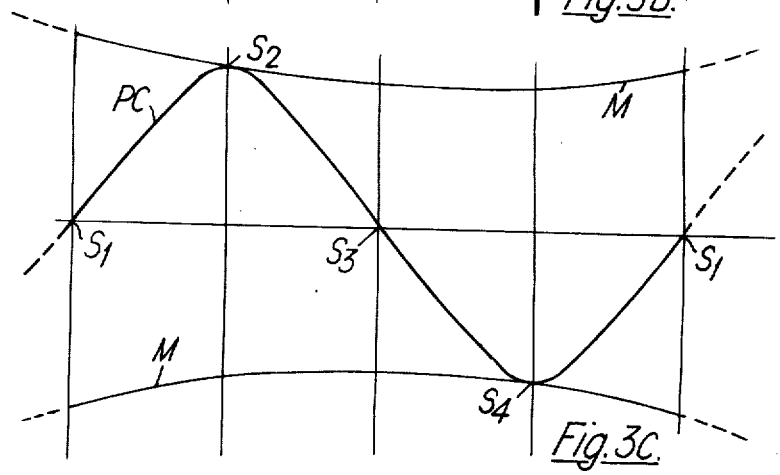

Referring to FIG. 3A, the input to the selector is constituted by samples $P_1$ and $P_2$ of signal M. Because the selector operates at twice the sampling frequency and changes the sign of alternate samples and also introduces zero samples Z between those from the converter A/D, the output (FIG. 3B) can define the positive and negative peaks and the zeros of an amplitude modulated sub-carrier PC (FIG. 3C). Alternatively expressed, the output is that obtainable by sampling an amplitude modulated 6.65 MHz sub-carrier at four times the sub-carrier frequency.

The output is processed by a vestigial side band filter VSBF and a group delay corrector GDC, a digital-to-analog converter D/A, and a low pass filter LPF to yield a modulated 6.65 MHz process-carrier (PC in FIG. 3C).

FIG. 2 shows by way of explanation the general arrangement of a suitable digital vestigial side band filter which must necessarily operate numerically. In general the frequency characteristics of a filter may be represented in the form $$R = C_1A_{t1} + C_2A_{t2} + C_3A_{t3} + \cdots C_nA_{tn}$$

where R is an instantaneous response, $At1, At2, At3 \cdots At_n$ represent signal amplitudes at time $t$, and earlier times $t_2, t_3 \cdots t_n$, and $C_1, C_2, C_3 \cdots C_n$ are coefficients. A good approximation to a required characteristic is obtainable with a conveniently small number of terms. The Filter of FIG. 2 uses digital shift registers $t_2, t_3$, and $t_4$ to produce delays of $t_2, t_3$ and $t_4$, multipliers $xC_1, xC_2, xC_3$ and $xC_4$ to multiply the signal and the delayed signals by coefficients $C_1, C_2, C_3$ and $C_4$, and an adder A to produce the filter output FO for the filter VSBF (FIG. 1). Filter characteristics suitable for different television standards are given in International Radio Consultative Committee, Documents of the XIth Planning Assembly, Oslo 1966, published by International Telecommunications Union, Geneva, 1967. By choosing the coefficients so that they are all derivable by dividing the same quantity by two, i.e. by removal of the least significant digits from values represented by binary numbers, economy in construction is obtainable without significantly reducing performance.

With the modulator of FIG. 1, linearity of modulation and the avoidance of incidental phase modulation are more reliably avoided than with analog equipment. Compensation for the transfer characteristic of the power amplifier of the transmitter is readily effected.

Figure 5A:
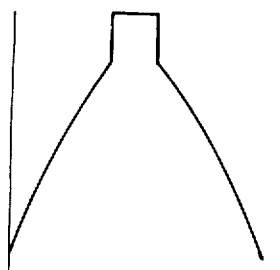
Figures 5B, 5C:
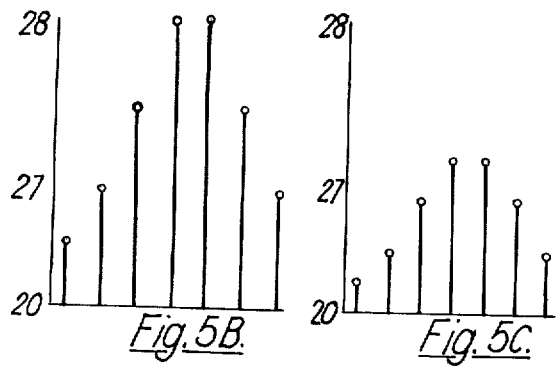
Figure 4:
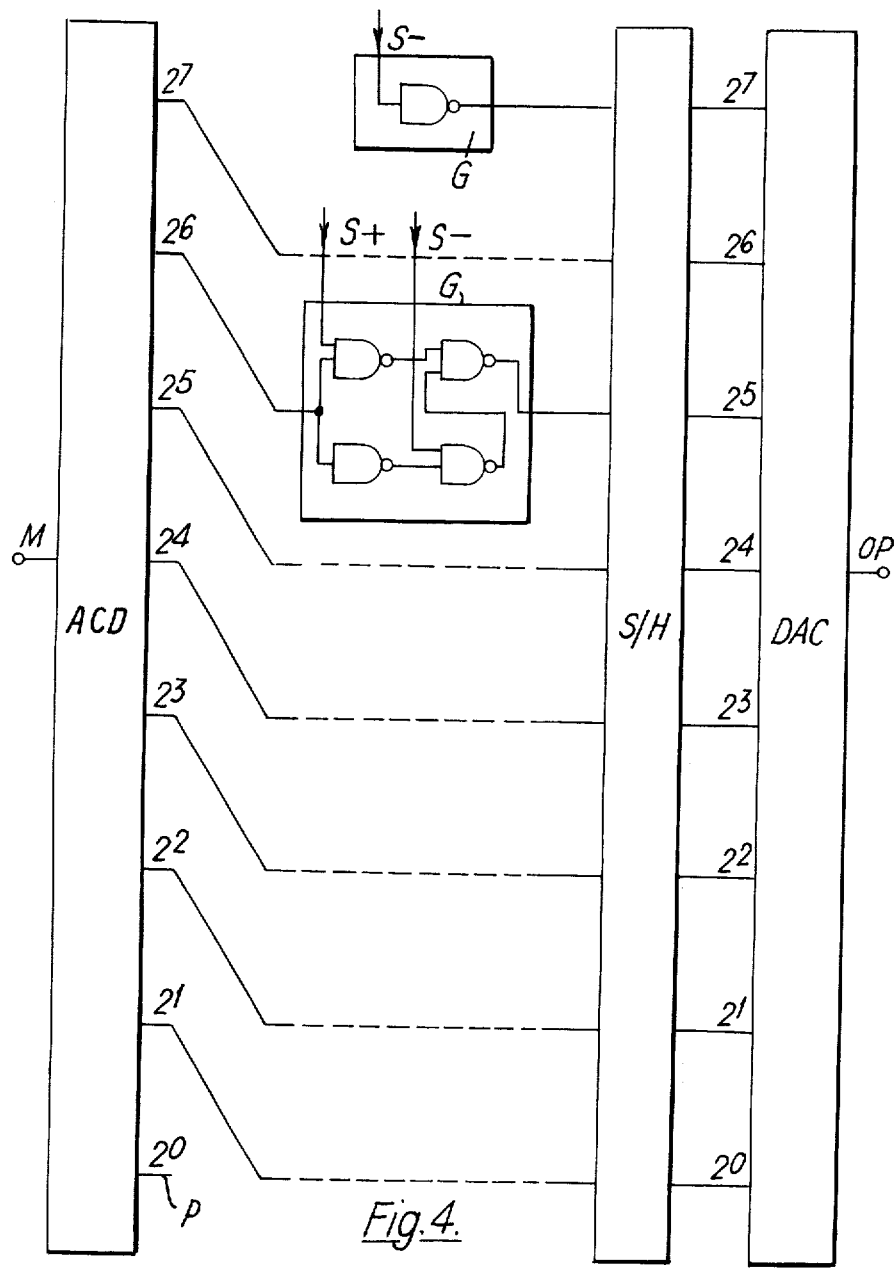
FIG. 4 shows a second modulator circuit.

The apparatus of FIG. 4 has its input M for the modulating signal (FIG. 5A) connected with an analog to digital converter ADC wherein it is converted to digital signals (FIG. 5B) of maximum magnitude $2^8$. By omitting the least significant digit at P, the signals are divided by two (FIG. 5C). The value $2^7$ is added to alternate signals by prefixing them with a 1-bit. The remaining signals are subtracted from $2^7$ by forming their complements (i.e. reversing the values of all the digits). Logic gates are shown in conventional notation at G. FIG. 5D shows the resulting output with alternate peak values signals reversed in the sense that they extend in opposite senses from the value $2^7$. From the logic gates, the signals pass to a sample-and-hold device S/H and thence to output OP via a digital to analog converter DAC.

Using the apparatus of FIG. 4, results comparable with good analog modulation were obtained even without a filter such as the filter VSBF of FIG. 1.

As will be understood the apparatus described with reference to the drawings, is described for purposes of illustration only and various departures may be made therefrom without departing from the principles of the invention. The frequency 6.65 MHz and related frequencies referred to (and for convenience given only to three significant figures) are of course appropriate ones for the standards used in television broadcasting in the United Kingdom. Other frequencies may be substituted as required.

I claim:

1. Apparatus for producing, at an output, digital output signals defining the timing and the levels of the peak values, and the timing of the zero values, for a sub-carrier signal amplitude modulated by a modulating signal which comprises means for providing digitized samples of the modulating signal at a rate of twice the frequency of the sub-carrier, selector means for feeding the samples to the output with alternate samples changed in value while preserving their timing relative to the remaining samples, and means for introducing nominally zero signals midway between the samples to define the occurrence of zero levels.

2. Apparatus according to claim 1 in which the modulating signal is a video signal.

3. Apparatus according to claim 1 in which the alternate signals are changed in value by a multiplier and the remaining signals are also passed through a multiplier so that the alternate signals and the remaining signals are subjected to equal delays in their multiplication.

4. Apparatus according to claim 1 in which the selector is operable to add alternate signals to a constant and subtract the remaining signals from the same constant.

5. Apparatus according to claim 1 provided with a digital vestigial side band filter for the digital output signals.

6. Apparatus according to claim 1 having a digital-to-analog converter operable to convert said digital output signals to analog form thereby forming said amplitude modulated sub-carrier.

* * * * *